United States Patent
Qi et al.

(10) Patent No.: US 12,419,081 B2
(45) Date of Patent: Sep. 16, 2025

(54) SILICON-ON-INSULATOR SUBSTRATE AND METHOD OF MANUFACTURING THE SAME

(71) Applicant: UNITED MICROELECTRONICS CORP., Hsin-Chu (TW)

(72) Inventors: Chunyuan Qi, Singapore (SG); Sheng Zhang, Singapore (SG); Xingxing Chen, Singapore (SG); Chien-Kee Pang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 40 days.

(21) Appl. No.: 17/510,392

(22) Filed: Oct. 26, 2021

(65) Prior Publication Data

US 2023/0094739 A1  Mar. 30, 2023

(30) Foreign Application Priority Data

Sep. 24, 2021 (CN) .......................... 202111119692.8

(51) Int. Cl.
*H10D 30/67* (2025.01)
*H10D 30/69* (2025.01)
*H10D 62/83* (2025.01)

(52) U.S. Cl.
CPC ....... *H10D 30/6744* (2025.01); *H10D 30/751* (2025.01); *H10D 62/83* (2025.01)

(58) Field of Classification Search
CPC .................. H01L 29/1054; H01L 29/16; H01L 29/78654; H01L 21/02002; H01L 21/02; H01L 21/6835; H01L 21/76256; H01L 2221/68327; H01L 21/00; H01L 21/64; H01L 21/67; H10D 30/6744; H10D 86/201; H10D 86/01
USPC .......................................................... 257/347
See application file for complete search history.

(56) References Cited

U.S. PATENT DOCUMENTS

| | | | |
|---|---|---|---|
| 10,923,503 B2* | 2/2021 | Cheng | H01L 21/02592 |
| 11,152,212 B2* | 10/2021 | Yoon | H01L 21/32155 |
| 11,676,969 B2* | 6/2023 | Liu | H01L 21/76256 |
| | | | 257/347 |
| 2002/0159739 A1* | 10/2002 | Yang | G02B 6/125 |
| | | | 385/141 |
| 2003/0034523 A1* | 2/2003 | Hiroshima | H01L 21/67775 |
| | | | 257/E21.415 |
| 2019/0172826 A1 | 6/2019 | Or-Bach | |
| 2020/0006385 A1 | 1/2020 | Cheng | |
| 2020/0098618 A1 | 3/2020 | Tsai | |
| 2020/0286734 A1 | 9/2020 | Yoon | |
| 2023/0230874 A1* | 7/2023 | Clemenceau | H01L 21/02211 |
| | | | 257/347 |

\* cited by examiner

*Primary Examiner* — Monica D Harrison
(74) *Attorney, Agent, or Firm* — Winston Hsu

(57) ABSTRACT

An silicon-on-insulator substrate is provided in the present invention, including a handler, a polysilicon trap-rich layer formed on the handler, an oxide layer formed on the polysilicon trap-rich layer and a monocrystalline silicon layer formed directly on the oxide layer, wherein a bonding interface is between the monocrystalline silicon layer and the oxide layer.

4 Claims, 2 Drawing Sheets

SILICON-ON-INSULATOR SUBSTRATE AND METHOD OF MANUFACTURING THE SAME

BACKGROUND OF THE INVENTION

1. Field of the Invention

The present invention relates generally to a silicon-on-insulator (SOI) substrate, and more specifically, to a silicon-on-insulator substrate with trap-rich layer and method of manufacturing the same.

2. Description of the Prior Art

The emergence of smartphone and 5G telecommunication network technology promotes tremendous demand for the silicon-on-insulator (SOI) substrate in the industry, especially for RF (radio frequency)-SOI substrate. RF-SOI is dedicated to be used in the manufacture of specific RFIC (ex. switch and antenna tuner) in smartphone or other products, which is equivalent to a RF version of SOI technology. Different from the fully-depleted SOI (FD-SOI) used in digital IC, a special trap-rich layer is formed in the RF-SOI substrate to trap free charge carriers in order to improve harmonic distortion and recover high resistance property of the substrate, so as to lower insertion loss of RF devices and improve system linearity.

Current conventional method of manufacturing a RF-SOI substrate usually employs the approach of bonding a device wafer and a handler wafer, wherein required circuit structures like device layers and metal interconnection layers are formed in advance on the device wafer, while the trap-rich layer is formed on the surface of handler wafer, so that the manufacture of RF-SOI substrate may be completed by bonding the trap-rich layer of handler wafer with the metal interconnection layers of device wafer.

According to the bonding manner of aforementioned conventional skill, the front side of the RF-SOI substrate after bonding will be the back side of original device wafer (i.e. the surface of silicon substrate), and circuit structures inside the RF-SOI is not connected out to the surface of RF-SOI. In order to reach out the inner circuit structures, additional backside metal interconnection layer and backside contacts for connecting the inner circuit and the backside metal interconnection layer are necessary after the wafer bonding process to operate the whole device. These additional components and relevant processes are cumbersome and costly and keep the cost of RF-SOI substrate at a high level.

SUMMARY OF THE INVENTION

In order to solve the cost problem of RF-SOI substrate, the present invention hereby provides a novel SOI structure and method of manufacturing the same, with features of the oxide layer bonded between the device substrate and the handler substrate serving as the buried oxide of the SOI substrate. The bonding interface is formed between the buried oxide and the device layer, and circuit structures like device layers and metal interconnection layer are manufactured on the front side of the substrate after bonding process. Therefore, it is not necessary to manufacture additional, costly backside contacts and wirings like those did in prior art.

One aspect of present invention is to provide a silicon-on-insulator substrate, including a handler, a polysilicon trap-rich layer formed on the handler, an oxide layer formed on the polysilicon trap-rich layer, and a monocrystalline silicon layer formed directly on the oxide layer, wherein a bonding interface is between the monocrystalline silicon layer and the oxide layer.

Another aspect of present invention is to provide a method of manufacturing a silicon-on-insulator substrate, including steps of forming a polysilicon trap-rich layer on a handler, forming an oxide layer on the polysilicon trap-rich layer, bonding a bulk silicon wafer on the oxide layer, and performing a thinning process and a trimming process to the bulk silicon wafer to form a monocrystalline silicon layer, wherein a bonding interface is between the monocrystalline silicon layer and the oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
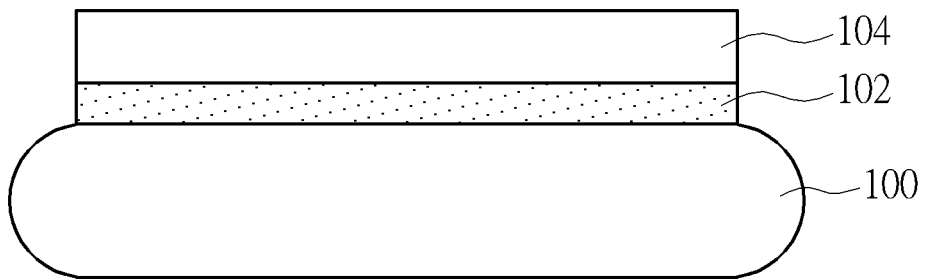
FIGS. 1-3 are cross-sections of a process flow of manufacturing a silicon-on-insulator substrate in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element (s) or feature (s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
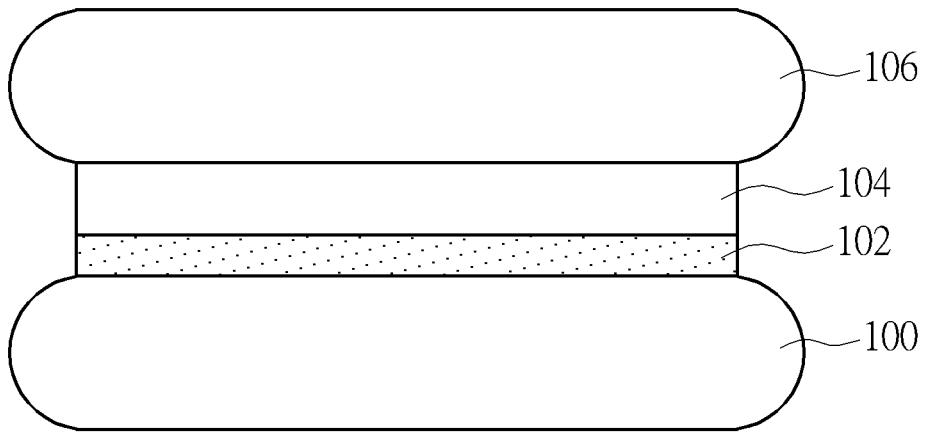
Figure 3:
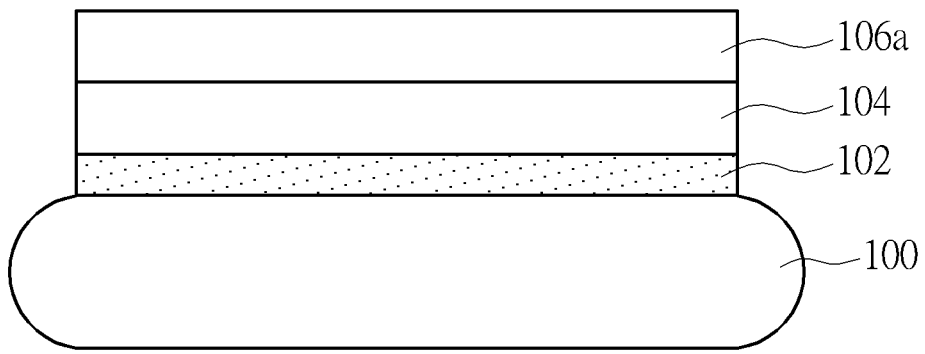

Firstly, please refer to FIGS. 1-3, which are cross-sections of a process flow of manufacturing a silicon-on-insulator substrate in accordance with the preferred embodiment of the present invention. As shown in FIG. 1, the process of present invention starts from a handler 100. In the embodiment, the handler 100 may be a silicon wafer or a glass substrate, preferably a high-resistance silicon substrate with a resistance between 3000 to 20000 Ω·cm, to lower the signal transmission loss and benefit the application of RFIC and mixed signal. Other semiconductor materials like III-V compound semiconductors, silicon carbide (SiC), silicon germanium (SiGe), germanium (Ge) may also be the material of handler 100.

Refer still to FIG. 1. A trap-rich layer, such as undoped or carbon-doped polysilicon trap-rich layer 102, is formed on the handler 100 to trap charges accumulating in the buried oxide and prevent crosstalk or nonlinear distortion of RF signals. The grain boundary of polysilicon may usually provide rather good trapping states, and possible inner crystallographic defects like dislocations and/or oxidation induced stacking faults (OISF) may also generate trapping states to trap charge carriers and prevent them accumulating along the top surface of handler 100. In the embodiment, the polysilicon trap-rich layer 102 is formed on the surface of handler 100 by deposition method, such as LPCVD, APCVD, PECVD, with a thickness between 3000 to 20000 Å.

Refer still to FIG. 1. After the polysilicon trap-rich layer 102 is formed, an oxide layer 104 such as a TEOS (tetraethoxysilane) oxide layer is then formed on the surface of polysilicon trap-rich layer 102. In the embodiment of present invention, the oxide layer 104 functions as a buried oxide of SOI substrate and a bonding layer for substrate bonding. In other embodiment, the material of oxide layer 104 may be other organosilanes, such as tetramethylsilane ($Si(CH_3)_4$), tetramethylcyclotetrasiloxane (TMCTS), octamethylcyclotetrasiloxane (OMCTS), bis(trimethylsilyl)amine (HMDS), triethoxysilane ($HSi(OC_2H_5)_3$), tris(dimethylamino)silane ($SiH(N(CH_3)_2)_3$)), or high-k material like aluminum oxide. The oxide layer 104 may be formed on the surface of polysilicon trap-rich layer 102 by deposition method, for example, by plasma enhanced chemical vapor deposition (PECVD), subatmospheric chemical vapor deposition (SACVD), low pressure chemical vapor deposition (LPCVD) or atomic layer deposition (ALD). A chemical-mechanical polishing (CMP) process may be performed after the oxide layer 104 is formed to thin the oxide layer 104 to a required thickness and provide flat bonding surface with a thickness between 300 to 3000 Å.

Please refer next to FIG. 2. After the oxide layer 104 is formed, a device substrate 106 is then bonded on the oxide layer 104. In the embodiment of present invention, the device substrate 106 may be a monocrystalline silicon substrate. The flat surface of organosilane-based oxide layer 104 and its hydrophilicity may easily form bondings to bond the device substrate 106 and the polysilicon trap-rich layer 102. The bonding process may include a plasma treatment to activate the bonding surface and a heat treatment with a duration about half an hour to few hours to form stronger bondings. In other embodiment, the device substrate 106 may also use other semiconductor material, such as III-V compound semiconductors, silicon carbide (SiC), silicon germanium (SiGe), germanium (Ge).

Please refer next to FIG. 3. After the device substrate 106 is bonded on the oxide layer 104, a grinding process is then performed to the device substrate 106 in order to thin the device substrate 106 into a device layer like a monocrystalline silicon layer 106a with a predetermined target thickness, to allow subsequent device stacking and high-density IC package. The grinding process may include coarse grinding, fine grinding and chemical-mechanical polishing (CMP) to thin the monocrystalline silicon substrate with a thickness larger than 50 μm into a monocrystalline silicon layer with a thickness about 400 to 1000 Å. In this way, the manufacture of the SOI substrate in present invention is completed. In this SOI substrate, the monocrystalline silicon layer 106a has lowest resistance and serves as a part of the device layer, while the polysilicon trap-rich layer 102 has highest resistance up to $10^8$ Ω·cm. The resistance of handler 100 is high relative to the monocrystalline silicon layer 106a, about 3000 to 20000 Ω·cm.

Figure 4:
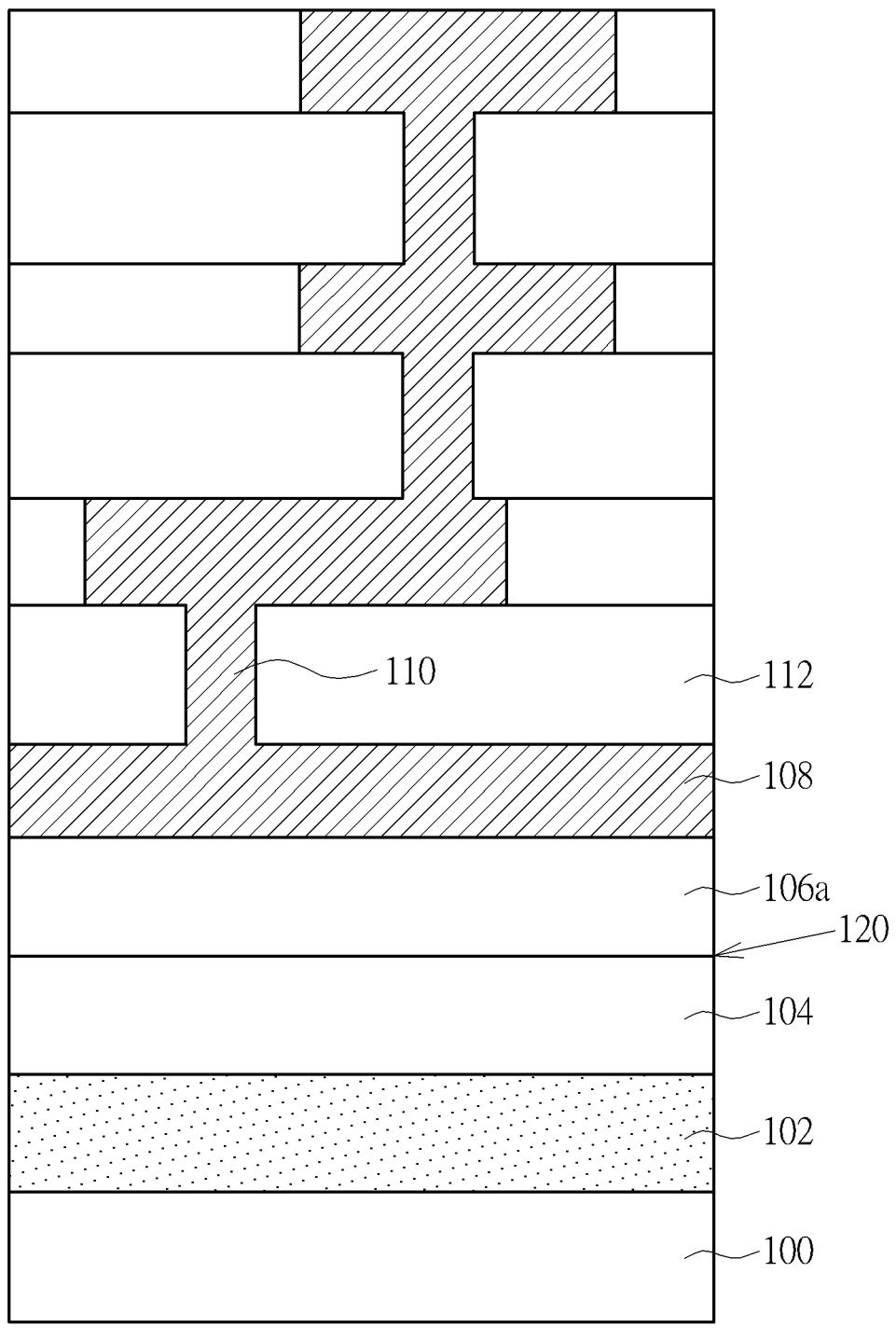
FIG. 4 is a cross-section of the silicon-on-insulator substrate in accordance with the preferred embodiment of the present invention.

Please refer next to FIG. 4, which is a cross-section of the silicon-on-insulator substrate in accordance with the preferred embodiment of the present invention. As shown in figure, the completed SOI substrate in the present invention sequentially include, from bottom to top, the high-resistance handler 100, the polysilicon trap-rich layer 102, the oxide layer 104 (serves as a buried oxide for the SOI substrate) and the monocrystalline silicon layer 106a (thinned device substrate 106), wherein the bonding interface 120 of SOI substrate is between the oxide layer 104 and the monocrystalline silicon layer 106a, which is different from the bonding interface between a buried oxide and a trapping layer in prior art. After the manufacture of SOI substrate is completed, conventional semiconductor FEOL (front-end-of-line) process and BEOL (back-end-of-line) process may then be performed on the surface of monocrystalline silicon layer 106a to form semiconductor devices (not shown) and interconnects like metal interconnection layer 108 and vias 110 in the inter-metal dielectric layer 112.

It can be understood from the aforementioned embodiment that the features of present invention is using the oxide layer bonding between the device substrate and the handler substrate as the buried oxide for SOI substrate. The bonding interface is between the buried oxide and the device layer, and circuit structures like device layers and metal interconnects are formed on the front side of the substrate after the bonding process. Therefore, it is not necessary to manufacture additional, costly backside contacts and wirings like those did in prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a silicon-on-insulator substrate, comprising:
    forming a carbon-doped polysilicon trap-rich layer on a handler;
    forming an organosilane-based oxide layer on said carbon-doped polysilicon trap-rich layer;
    bonding a surface of a bulk silicon wafer directly on a surface of said organosilane-based oxide layer, wherein said surface of said bulk silicon wafer has no insulating layer formed thereon, and said bonding comprises:
        performing a plasma treatment to said surface of said bulk silicon wafer and said surface of said organosilane-based oxide layer; and
        after bonding said surface of said bulk silicon wafer and said surface of said organosilane-based oxide layer, performing a heat treatment to form stronger bonding between said surface of said bulk silicon wafer and said surface of said organosilane-based oxide layer;
    performing a thinning process and a trimming process to said bulk silicon wafer through a grinding process to form a monocrystalline silicon layer.

2. The method of manufacturing a silicon-on-insulator substrate of claim 1, further comprising performing a chemical mechanical polishing process to said organosilane-based oxide layer before bonding said bulk silicon wafer.

3. The method of manufacturing a silicon-on-insulator substrate of claim 1, wherein comprising performing a carbon doping process to said a polysilicon trap-rich layer to form said carbon-doped polysilicon trap-rich layer.

4. The method of manufacturing a silicon-on-insulator substrate of claim 1, wherein said handler is a silicon wafer or a glass substrate.

* * * * *